(12) United States Patent
Chang et al.

(10) Patent No.: US 8,334,174 B2
(45) Date of Patent: Dec. 18, 2012

(54) CHIP SCALE PACKAGE AND FABRICATION METHOD THEREOF

(75) Inventors: Chiang-Cheng Chang, Tiachung (TW); Hsin-Yi Liao, Taichung (TW); Hsu-Hsi Chang, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 59 days.

(21) Appl. No.: 12/862,473

(22) Filed: Aug. 24, 2010

(65) Prior Publication Data
US 2012/0018870 A1    Jan. 26, 2012

(30) Foreign Application Priority Data
Jul. 26, 2010   (TW) ................. 99124489 A (51) Int. Cl.
  *H01L 21/00*   (2006.01)
(52) U.S. Cl. . 438/118; 257/690; 257/783; 257/E21.502; 438/112; 438/613
(58) Field of Classification Search .............. 257/690, 257/E21.502, 783; 438/106, 112, 613, 118
See application file for complete search history.

(56) References Cited

U.S. PATENT DOCUMENTS

| | | |
|---|---|---|
| 5,892,179 A | 4/1999 | Rinne et al. |
| 6,103,552 A | 8/2000 | Lin |
| 6,271,469 B1 | 8/2001 | Ma et al. |
| 6,287,893 B1 | 9/2001 | Elenius et al. |
| 6,350,668 B1 | 2/2002 | Chakravorty |
| 6,433,427 B1 | 8/2002 | Wu et al. |
| 6,498,387 B1 | 12/2002 | Yang |
| 6,586,822 B1 | 7/2003 | Vu et al. |
| 6,902,950 B2 * | 6/2005 | Ma et al. ......... 438/106 |
| 7,019,406 B2 | 3/2006 | Huang et al. |
| 7,238,602 B2 * | 7/2007 | Yang ............. 438/613 |
| 7,534,361 B2 * | 5/2009 | Akamatsu et al. ....... 216/14 |
| 2004/0178495 A1* | 9/2004 | Yean et al. .......... 257/723 |
| 2009/0155956 A1* | 6/2009 | Pohl et al. .......... 438/109 |
| 2009/0160043 A1* | 6/2009 | Shen et al. .......... 257/690 |

* cited by examiner

*Primary Examiner* — John C Ingham
(74) *Attorney, Agent, or Firm* — Peter F. Corless; Steven M. Jensen; Edwards Wildman Palmer LLP (57) ABSTRACT

A fabrication method of a chip scale package includes: disposing a chip on a carrier board and embedding the chip into a composite board having a hard layer and a soft layer; and removing the carrier board so as to perform a redistribution layer (RDL) process, thereby solving the conventional problems caused by directly attaching the chip on an adhesive film, such as film-softening caused by heat, encapsulant overflow, chip deviation and contamination, etc., all of which may result in poor electrical connection between the wiring layer and the chip electrode pads in the subsequent RDL process and even waste products as a result.

9 Claims, 8 Drawing Sheets

CHIP SCALE PACKAGE AND FABRICATION METHOD THEREOF

CROSS-REFERENCES TO RELATED APPLICATIONS

This application claims under 35 U.S.C. §119(a) the benefit of Taiwanese Application No. 099124489 filed Jul. 26, 2010, the entire contents of which is incorporated herein by reference.

BACKGROUND OF THE INVENTION

1. Field of the Invention

The present invention relates generally to semiconductor packages and fabrication methods thereof, and more particularly, to a chip scale package and a fabrication method thereof.

2. Description of Related Art

A chip scale package (CSP) is characterized in that the package size is equivalent to the size of the chip that is disposed in the package. U.S. Pat. No. 5,892,179, U.S. Pat. No. 6,103,552, U.S. Pat. No. 6,287,893, U.S. Pat. No. 6,350,668 and U.S. Pat. No. 6,433,427 disclose a conventional CSP structure, wherein a built-up structure is directly formed on a chip without using a chip carrier, such as a substrate or a lead frame, and a redistribution layer (RDL) technique is used to accomplish a redistribution of the electrode pads of the chip to a desired pattern.

However, the application of the RDL technique or disposing of conductive traces on the chip is limited by the size of the chip or the area of the active surface of the chip. Particularly, as chips are developed towards high integration and compact size, they do not have enough surface area for mounting of more solder balls for electrical connection to an external device.

Accordingly, U.S. Pat. No. 6,271,469 provides a fabrication method of a wafer level chip scale package (WLCSP), wherein a built-up layer is formed on the chip of the package so as to provide enough surface area for disposing I/O terminals or solder balls.

Figure 1A:
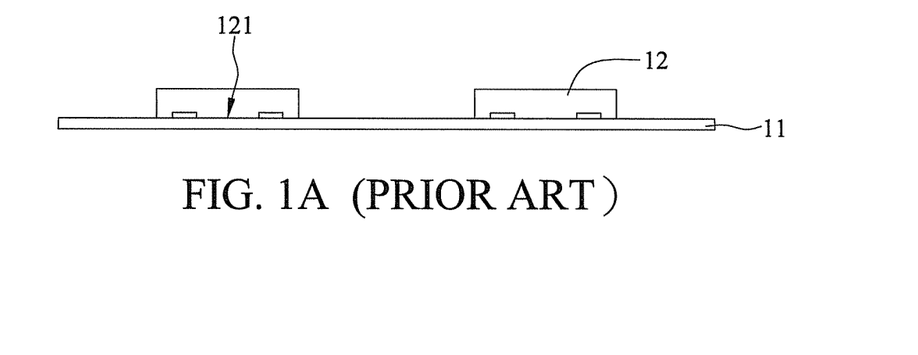
FIGS. 1A to 1C are cross-sectional views showing a fabrication method of a wafer level chip scale package according to U.S. Pat. No. 6,271,469.
Figure 1B:
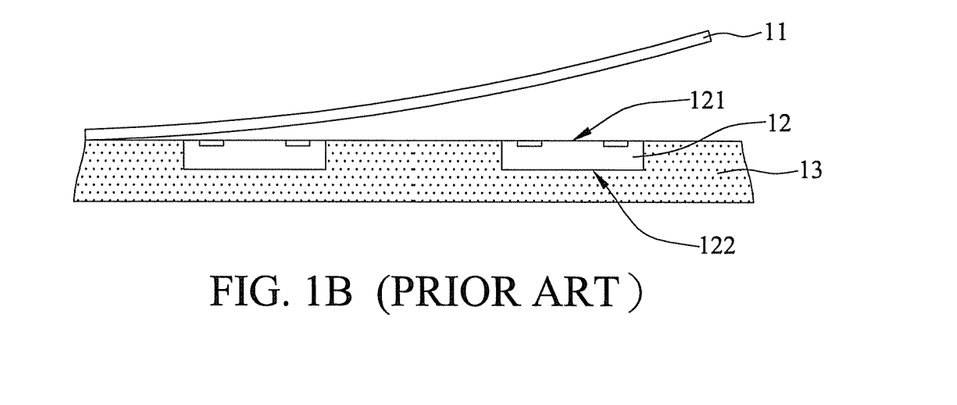
Figure 1C:
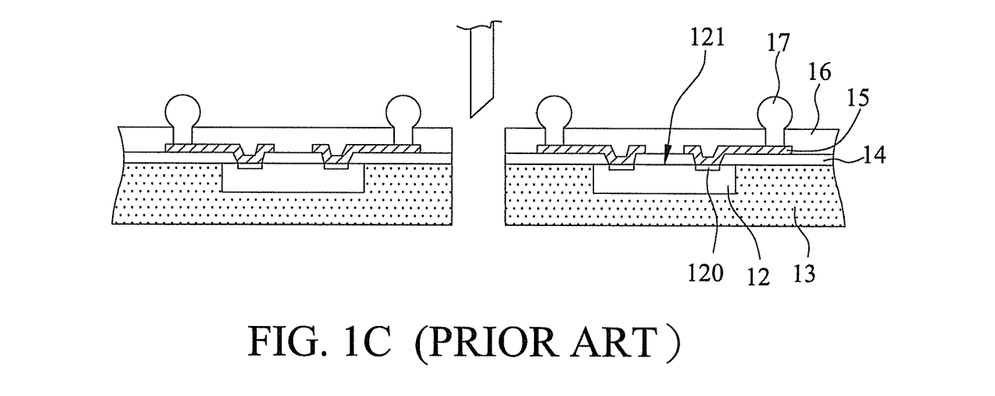

Referring to FIG. 1A, an adhesive film 11 is prepared, and a plurality of chips 12, each having opposing active surface 121 and inactive surface 122, is provided and attached to the adhesive film 11 via the active surfaces 121 thereof, respectively. Therein, the adhesive film 11 can be such as a heat-sensitive adhesive film. Referring to FIG. 1B, a package molding process is performed to form an encapsulant 13 such as an epoxy resin encapsulating the inactive surfaces 122 and side surfaces of the chips 12. Then, the adhesive film 11 is removed by heating so as to expose the active surfaces 121 of the chips 12. Referring to FIG. 1C, by using an RDL technique, a dielectric layer 14 is coated on the active surfaces 121 of the chips 12 and the surface of the encapsulant 13, a plurality of openings is formed in the dielectric layer 14 to expose the electrode pads 120 of the chips, a wiring layer 15 is then formed on the dielectric layer 14 and electrically connected to the electrode pads 120, and a solder mask layer 16 is further coated on the wring layer 15 and solder balls 17 are mounted to predefined positions of the wiring layer 15. Then, a singulation process is performed to obtain a plurality of packages.

In the above-described packages, the surface of the encapsulant 13 encapsulating the chip 12 is larger than the active surface 121 of the chip 12 and therefore allows more solder balls 17 to be mounted thereon for electrically connecting to an external device.

However, since the chip 12 is fixed by being attached to the adhesive film 11, deviation of the chip 12 can easily occur due to film-softening and extension caused by heat, especially in the package molding process, thereby adversely affecting the electrical connection between the electrode pads 120 of the chip 12 and the wring layer 15 during the subsequent RDL process.

Figure 2:
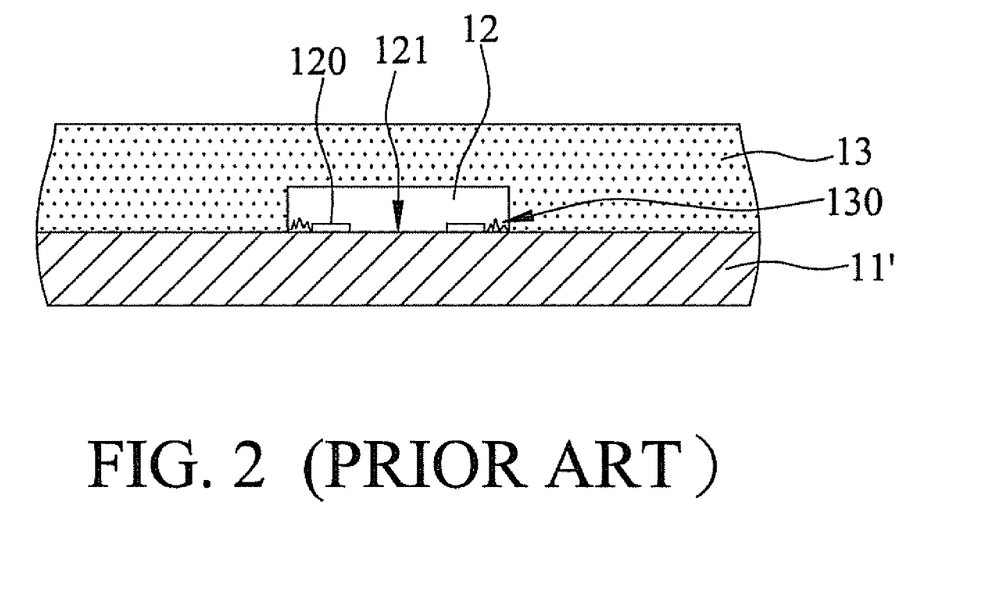
FIG. 2 is a cross-sectional view showing encapsulant overflow of the package.

Referring to FIG. 2, in another package molding process, since the adhesive film 11' can easily be softened by heat, overflow 130 of the encapsulant 13 can easily occur to the active surface 121 of the chip 12 and even contaminate the electrode pads 120 of the chip 12, thus resulting in poor electrical connection between the electrode pads and subsequently formed wiring layer and even causing product failure.

Figure 3A:
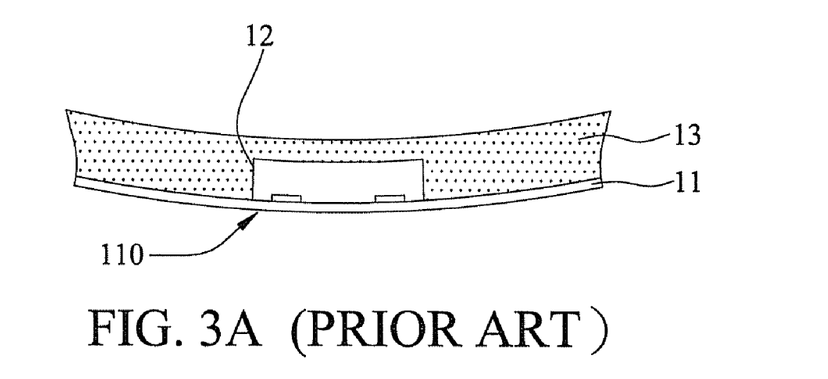
FIG. 3A is a cross-sectional view showing warpage of the package.
Figure 3B:
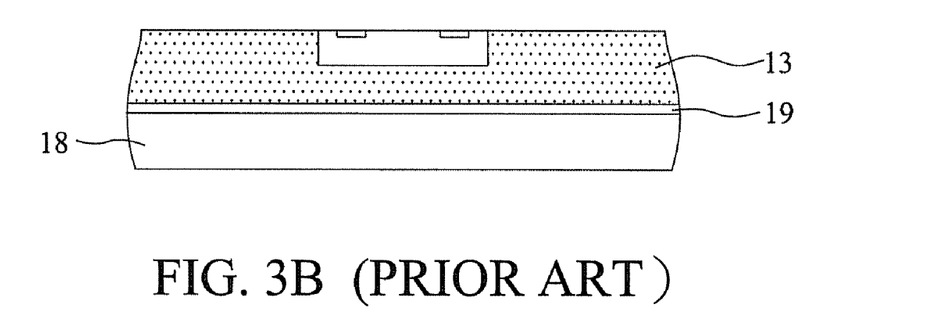
FIG. 3B is a cross-sectional view showing application of a hard carrier to the package.
Figure 3C:
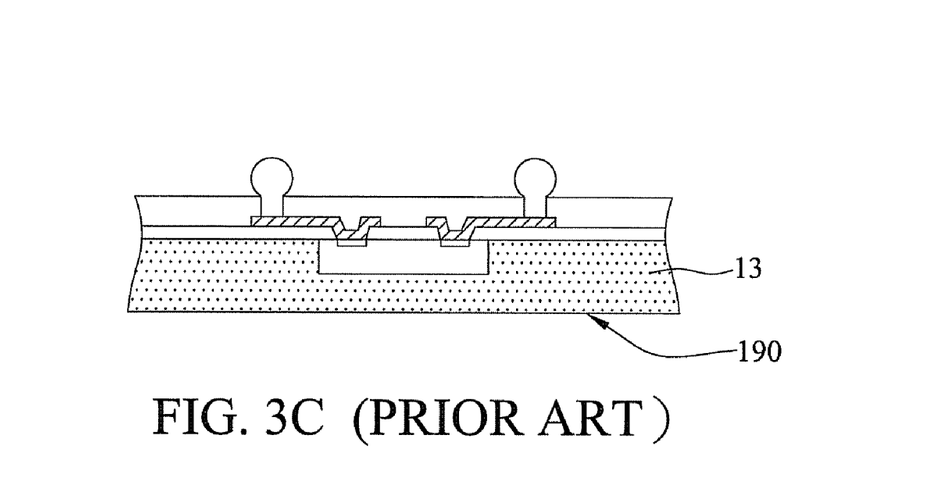
FIG. 3C is a cross-sectional view showing the problem of adhesive residue of the package.

Referring to FIG. 3A, since the adhesive film 11 supports a plurality of chips 12, warpage can easily occur to the adhesive film 11 and the encapsulant 13, especially when the encapsulant 13 has a small thickness. As such, the dielectric layer formed on the chips 12 during the RDL process is uneven. To overcome this drawback, a hard carrier 18 as shown in FIG. 3B is required so as for the encapsulant 13 to be secured thereto through an adhesive 19. However, when the RDL process is completed and the hard carrier 18 is removed, some adhesive residue 190 may be left on the encapsulant 13, as shown in FIG. 3C. Related techniques are disclosed in U.S. Pat. No. 6,498,387, U.S. Pat. No. 6,586,822, U.S. Pat. No. 7,019,406 and U.S. Pat. No. 7,238,602.

Therefore, it is imperative to provide a chip scale package and a fabrication method thereof so as to ensure the electrical connection quality of the package, improve the product reliability and reduce the fabrication cost.

SUMMARY OF THE INVENTION

In view of the above-described drawbacks, the present invention provides a fabrication method of a chip scale package, which comprises the steps of: providing a carrier board having an adhesive layer; providing at least a chip having an active surface with a plurality of electrode pads and an inactive surface opposite to the active surface, and disposing the chip on the adhesive layer via the active surface thereof; providing a composite board comprising a hard layer and a soft layer, wherein the soft layer has opposite first and second surfaces, the hard layer is disposed on the second surface of the soft layer, and the first surface of the soft layer is bonded to the adhesive layer such that the chip is embedded in the soft layer; removing the carrier board and the adhesive layer so as to expose the active surface of the chip and a portion of the first surface of the soft layer; forming a first dielectric layer on the first surface of the soft layer and the active surface of the chip, and forming a plurality of openings in the first dielectric layer to expose the electrode pads of the chip, respectively; and forming on the first dielectric layer a first wiring layer electrically connected to the electrode pads of the chip.

Therein, the soft layer can be made of ajinomoto build-up film (ABF), polyimide (PI) or polymerized siloxanes. The hard layer can be made of silicon material, metal, prepreg (PP) or copper clad laminate (CCL). The Young's modulus of the hard layer is over five times that of the soft layer.

The method can further comprise forming a solder mask layer on the first dielectric layer and the first wiring layer, and forming a plurality of openings in the solder mask layer for mounting of conductive components.

Further, the method can use a redistribution layer (RDL) technique to form a built-up structure on the first dielectric layer and the first wiring layer, and form a solder mask layer on the built-up structure and a plurality of openings in the solder mask layer for mounting of conductive components.

The method can further comprise forming at least a through hole penetrating the first dielectric layer, the soft layer and the hard layer, and forming a second wiring layer on the hard layer and forming a conductive through hole in the through hole to electrically connect the first and second wiring layers.

Further, the solder mask layer can be formed on the hard layer and the second wiring layer and a plurality of openings can be formed in the solder mask layer for mounting of conductive components. Alternatively, a built-up structure can be formed on the hard layer and the second wiring layer, and a solder mask layer can further be formed on the built-up structure and a plurality of openings can be formed in the solder mask layer for mounting of conductive components.

The method can further comprise performing a singulation process before or after the mounting of conductive components; and mounting an electronic component to the conductive components.

According to the above-described method, the present invention further discloses a chip scale package, which comprises: a soft layer having opposite first and second surfaces; at least a chip embedded in the soft layer and having an active surface with a plurality of electrode pads and an inactive surface opposite to the active surface, wherein the active surface of the chip is exposed from the first surface of the soft layer; a hard layer formed on the second surface of the soft layer; a first dielectric layer formed on the first surface of the soft layer and the active surface of the chip and having a plurality of openings for exposing the electrode pads of the chip; and a first wiring layer formed on the first dielectric layer and electrically connected to the electrode pads.

Therein, the soft layer can be made of ajinomoto build-up film (ABF), polyimide (PI) or polymerized siloxanes. The hard layer can be made of silicon material, metal, prepreg (PP) or copper clad laminate (CCL). The Young's modulus of the hard layer is over five times that of the soft layer.

The package can further comprise a solder mask layer formed on the first dielectric layer and the first wiring layer and having a plurality of openings for exposing a portion of the first wiring layer, and conductive components mounted in the openings of the solder mask layer on the first wiring layer, respectively.

Further, the package can comprise a built-up structure formed on the first dielectric layer and the first wiring layer. In addition, the package can comprise a solder mask layer formed on the built-up structure and having a plurality of openings formed therein, and conductive components mounted in the openings of the solder mask layer and electrically connecting to the first wiring layer.

In the above-described package, an electronic component can be mounted on the conductive components.

According to another embodiment, the package can further comprise a second wiring layer formed on the hard layer, and at least a conductive through hole penetrating the first dielectric layer, the soft layer and the hard layer for electrically connecting the first and second wiring layers.

According to the above-described structure, the package can further comprise a solder mask layer formed on the hard layer and the second wiring layer and having a plurality of openings for exposing a portion of the second wiring layer, and conductive components mounted in the openings of the solder mask layer on the second wiring layer.

Alternatively, the package can comprise a built-up structure formed on the hard layer and the second wiring layer, and further comprise a solder mask layer formed on the built-up structure and having a plurality of openings, and conductive components mounted in the openings of the solder mask layer.

According to the present invention, a composite board comprising a hard layer and a soft layer is provided, wherein the soft layer has opposite first and second surfaces and the hard layer is disposed on the second surface of the soft layer, a chip is mounted on a carrier board first and then embedded in the first surface of the soft layer, and subsequently the carrier board is removed so as to allow a redistribution layer (RDL) process to be performed, thereby solving the conventional problems caused by directly attaching the chip on an adhesive film, such as film-softening caused by heat, encapsulant overflow, chip deviation and contamination and further preventing poor electrical connection between the wiring layer and the chip electrode pads in the subsequent RDL process and low product yield. Furthermore, through the use of the composite board, the present invention avoids warpage of the package and also eliminates the need of an additional hard carrier for fixing the package in a RDL process and accordingly avoids adhesive residue as in the prior art.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'first', 'second', 'up', 'down', 'inside' etc. are only used as a matter of descriptive convenience and not intended to have any other significance or provide limitations for the present invention.

FIGS. 4A to 4H are cross-sectional views showing a fabrication method of a chip scale package according to the present invention.

Figure 4A:
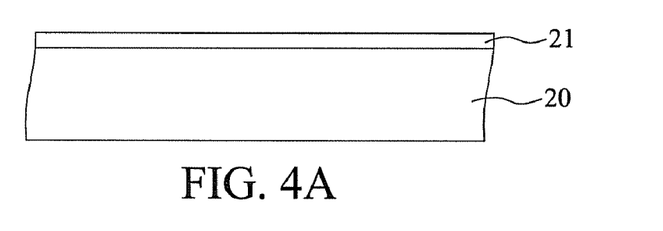
FIGS. 4A to 4H are cross-sectional views showing a chip scale package and a fabrication method thereof according to the present invention, wherein FIG. 4G' is another embodiment of FIG. 4G.

Referring to FIG. 4A, a carrier board 20 having an adhesive layer 21 is provided.

Figure 4B:
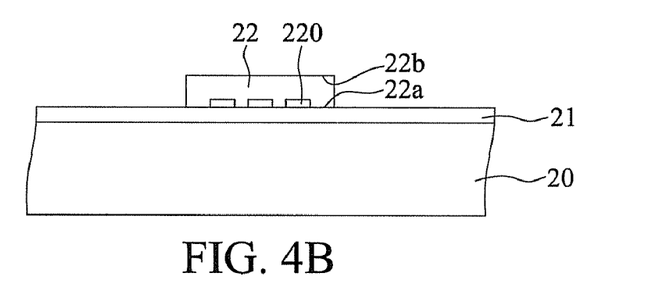

Referring to FIG. 4B, a chip 22 having an active surface 22a with a plurality of electrode pads 220 and an inactive surface 22b opposite to the active surface 22a is provided and disposed on the adhesive layer 21 via the active surface 22a thereof.

Figure 4C:
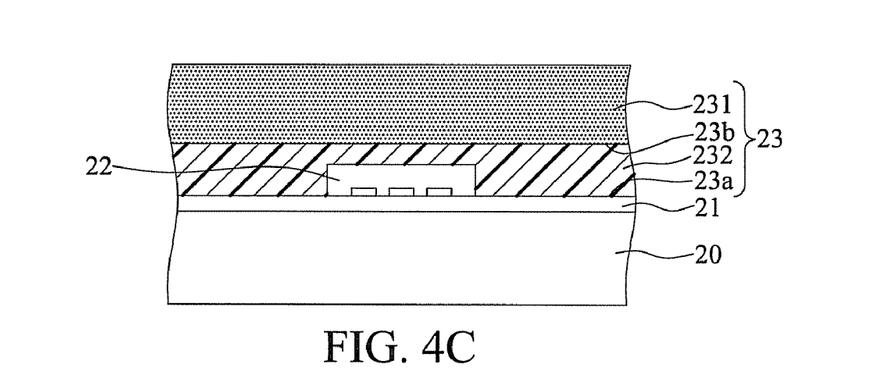

Referring to FIG. 4C, a composite board 23 is provided, which has a hard layer 231 and a soft layer 232 having opposite first surface 23a and second surface 23b. Therein, the hard layer 231 is disposed on the second surface 23b of the soft layer 232, and the first surface 23a of the soft layer 232 is bonded to the adhesive layer 21 such that the chip 22 is embedded in the first surface 23a of the soft layer 232.

The soft layer 232 can be made of ajinomoto build-up film (ABF), polyimide (PI), or polymerized siloxanes (silicone, also called polysiloxanes). The hard layer 231 can be made of silicon material such as silicon wafer or glass, metal, prepreg (PP) or copper clad laminate (CCL). The Young's modulus of the hard layer 231 is, preferably, over five times that of the soft layer 232 so as to avoid warpage of the package.

Figure 4D:
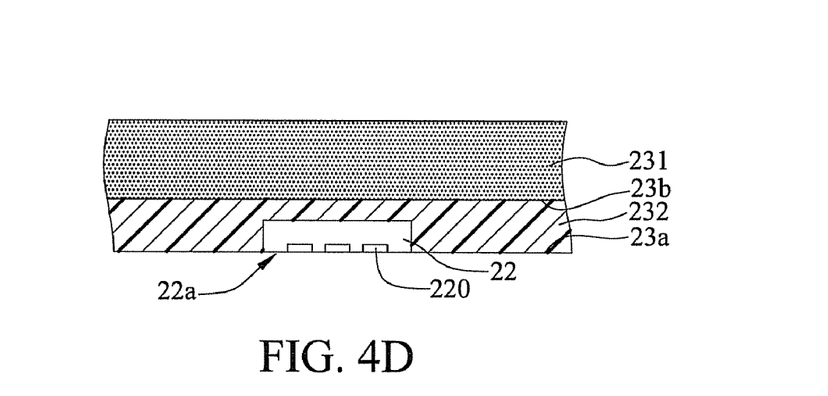

Referring to FIG. 4D, the carrier board 20 and the adhesive layer 21 are removed to expose the active surface 22a of the chip 22 and a portion of the first surface 23a of the soft layer 232.

Referring back to FIG. 4C, after the first surface 23a of the soft layer 232 is bonded to the adhesive layer 21 and the chip 22 is embedded in the soft layer 232, a baking process can be performed to cure the soft layer 232. Alternatively, referring to FIG. 4D, the baking process can be performed after the carrier board 20 and the adhesive layer 21 are removed.

Figure 4E:
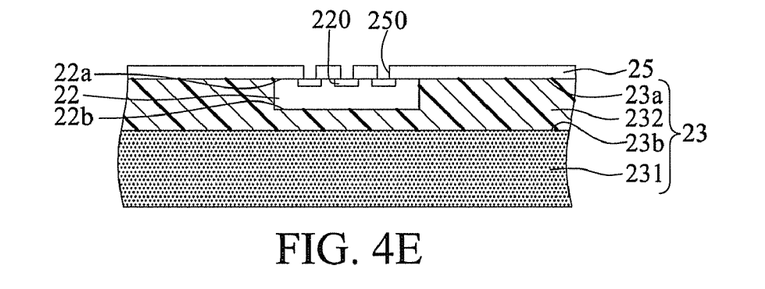

Referring to FIG. 4E, a first dielectric layer 25 is formed on the first surface 23a of the soft layer 232 and the active surface 22a of the chip 22, and a plurality of openings 250 is formed in the first dielectric layer 25 to expose the electrode pads 220, respectively.

Figure 4F:
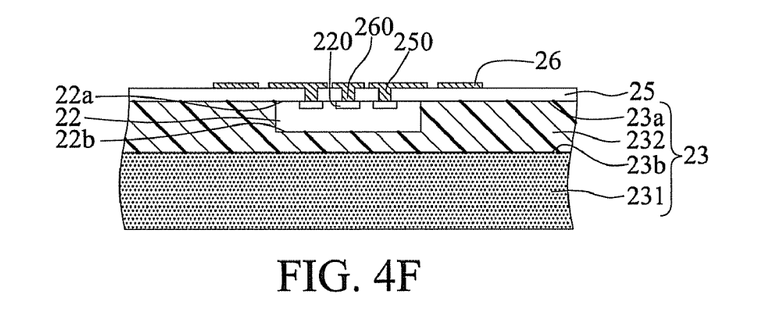

Referring to FIG. 4F, a patterning process is performed on the first dielectric layer 25 to form a first wiring layer 26 thereon, and a plurality of first conductive vias 260 is formed in the openings 250 for electrically connecting to the electrode pads 220, respectively.

Figure 4G:
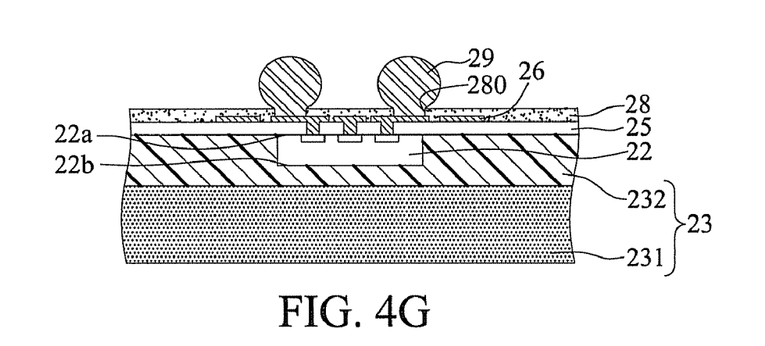

Referring to FIG. 4G, a solder mask layer 28 is formed on the first dielectric layer 25 and the first wiring layer 26, and a plurality of openings 280 is formed in the solder mask layer 28 to expose a certain portion of the first wiring layer 26 so as to allow conductive components 29 to be mounted thereon, wherein the conductive components 29 can be solder balls or metal pins.

Referring to FIG. 4G', a built-up structure 27 is formed on the first dielectric layer 25 and the first wiring layer 26, which has at least a second dielectric layer 270, a wiring layer 271 disposed on the second dielectric layer 270 and electrically connected to the first wiring layer 26 through a plurality of second conductive vias 272. Further, a solder mask layer 28 is formed on the built-up structure 27, and a plurality of openings 280 is formed in the solder mask layer 28 to expose a certain portion of the wiring layer 271 for mounting of conductive components 29.

Figure 4H:
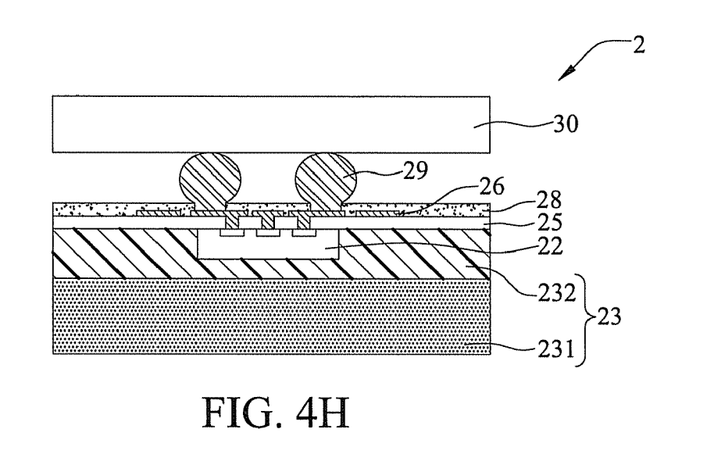

Referring to FIG. 4H, after the solder mask layer 28 and the conductive components 29 are formed, a singulation process can be performed to obtain a package 2 with a single chip embedded therein. An electronic component 30 such as a circuit board or a semiconductor chip can be mounted to at least one side of the package 2 through the conductive components 29.

Figure 5:
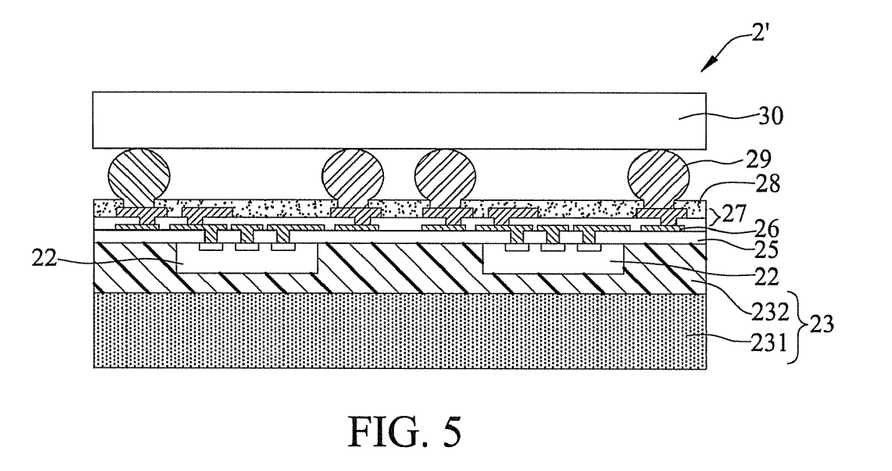
FIG. 5 is a cross-sectional view of a chip scale package according to another embodiment of the present invention.

Alternatively, referring to FIG. 5, a package 2' with a plurality of chips 22 can be obtained through the singulation process. Further, an electronic component 30 such as a circuit board or a semiconductor chip can be mounted to at least one side of the package 2' through the conductive components 29.

According to the present invention, the chip 22 is disposed on the carrier board 20 and embedded in the soft layer 232 while the hard layer 231 is disposed on the second surface 23b of the soft layer 232, and then the carrier board 20 is removed so as to avoid the conventional problems such as film-softening caused by heat, encapsulant overflow, chip deviation and contamination caused by directly attaching the chip on an adhesive film as in the prior art. Further, through support of the hard layer 231, the present invention avoids warpage of the package.

Since no chip deviation or warpage occurs, a preferred electrical connection between the first wiring layer 26 and the electrode pads 220 of the chip 22 can be achieved during a redistribution layer (RDL) process, thereby increasing the product yield.

Furthermore, the RDL process of the present invention eliminates the need of a hard carrier for fixing the package as in the prior art and accordingly no adhesive residue is left on the package.

Figure 6A:
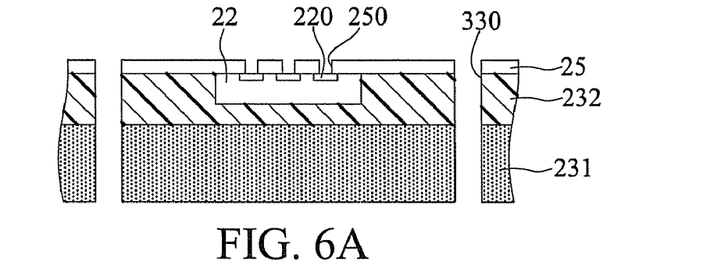
FIGS. 6A to 6D are cross-sectional views showing another chip scale package and a fabrication method thereof according to the present invention, wherein FIG. 6C' is another embodiment of FIG. 6C.
Figure 6B:
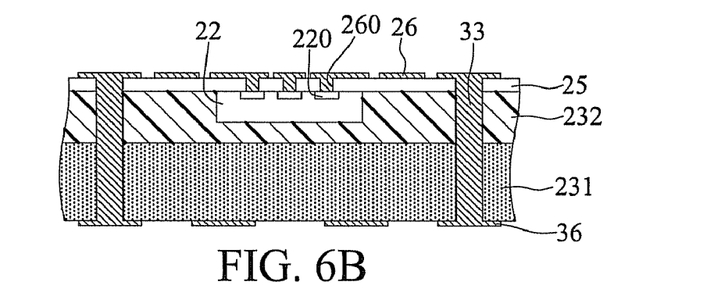
Figure 6C:
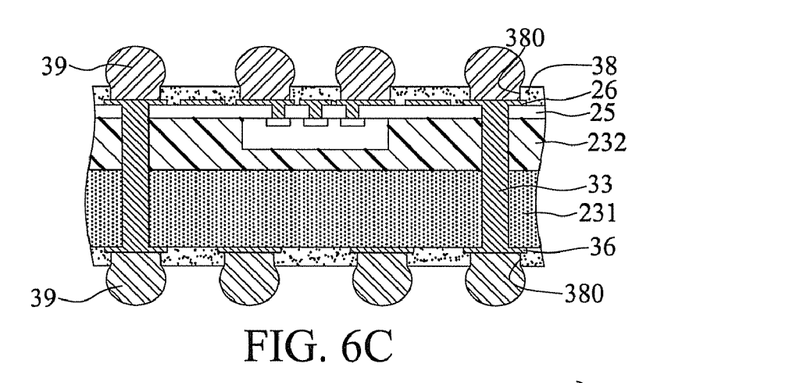

FIGS. 6A to 6C are cross-sectional views showing another fabrication method of a chip scale package according to the present invention. The difference of the present method from the above-described method is a second wiring layer 36 is formed on the hard layer 231.

Referring to FIG. 6A, continuing from FIG. 4E, when the openings 250 are formed in the first dielectric layer 25, at least a through hole 330 is formed to penetrate the first dielectric layer 25, the soft layer 232 and the hard layer 231.

Referring to FIG. 6B, a first wiring layer 26 is formed on the first dielectric layer 25 and first conductive vias 260 are formed in the openings 250 of the first dielectric layer 25 for electrically connecting to the electrode pads 220, respectively. Meanwhile, the hard layer 231 is patterned to form a second wiring layer 36 and a conductive through hole 33 is formed in the through hole 330 for electrically connecting the first and second wiring layers 26, 36.

Referring to FIG. 6C, a solder mask layer 38 is formed on the first dielectric layer 25, the first wiring layer 26, the hard layer 231 and the second wiring layer 36, and a plurality of openings 380 is formed to expose certain portions of the first and second wiring layers 26, 36 for mounting of conductive components 39. Therein, the conductive components 39 can be solder balls or metal pins.

Referring to FIG. 6C', a built-up structure 37 can be formed on the first dielectric layer 25, the first wiring layer 26, the hard layer 231 and the second wiring layer 36. Alternatively, the built-up structure 37 can be only formed on the first dielectric layer 25 and the first wiring layer 26, or only formed on the hard layer 231 and the second wiring layer 36.

Referring to FIG. 6C', the built-up structure 37 has at least a second dielectric layer 370, a wiring layer 371 disposed on the second dielectric layer 370 and electrically connecting the first and second wiring layers 26, 36 through second conductive vias 372. Further, a solder mask layer 38 can be formed on the built-up structure 37 and a plurality of openings 380 can be formed in the solder mask layer 38 to expose a certain portion of the wiring layer 371 for mounting of conductive components 39.

If the built-up structure 37 is only disposed on the first dielectric layer 25 and the first wiring layer 26, the solder mask layer 38 is formed on the built-up structure 37, the hard layer 231 and the second wiring layer 36. If the built-up structure 37 is only disposed on the hard layer 231 and the second wiring layer 36, the solder mask layer 38 is formed on the built-up structure 37, the first dielectric layer 25 and the first wiring layer 26.

Figure 6D:
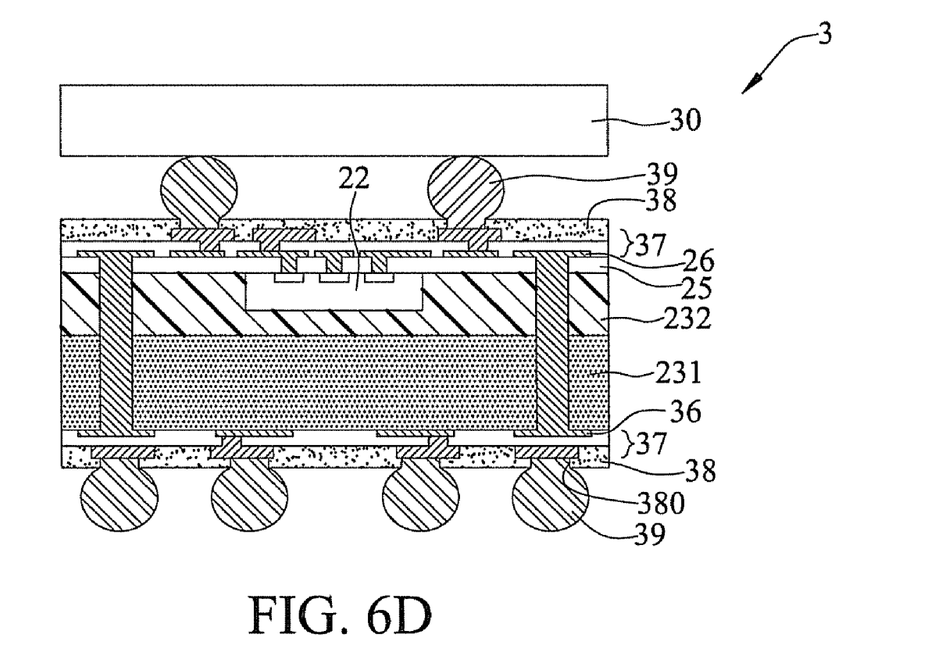

Referring to FIG. 6D, continuing from FIG. 6C', a singulation process is performed to obtain a package 3 with a single chip embedded therein. An electronic component 30 such as a circuit board or a semiconductor chip can be mounted to at least one side of the package 3 through the conductive components 39.

Alternatively, a package with a plurality of chips can be obtained through the singulation process. Since the process is similar to the process of FIG. 5, detailed description thereof is omitted herein.

The present invention further provides a chip scale package, which comprises: a soft layer 232 having opposite first and second surfaces 23a, 23b, a chip 22 embedded in the first surface 23a of the soft layer 232, a hard layer 231 disposed on the second surface 23b of the soft layer 232, a first dielectric layer 25 disposed on the first surface 23a of the soft layer 232 and the active surface 22a of the chip 22, and a first wiring layer 26 disposed on the first dielectric layer 25.

The soft layer 232 can be made of ajinomoto build-up film (ABF), polyimide (PI), or polymerized siloxanes (polysiloxanes).

The chip 22 has an active surface 22a with a plurality of electrode pads 220 and an inactive surface 22b opposite to the active surface 22a, and the active surface 22a of the chip 22 is exposed from the first surface 23a of the soft layer 232.

The hard layer 231 can be made of silicon material such as silicon wafer or glass, metal, prepreg or copper clad laminate. The Young's modulus of the hard layer 231 is preferably over five times that of the soft layer 232 so as to avoid warpage of the package.

The first dielectric layer 25 has a plurality of openings 250 for exposing the electrode pads 220, respectively.

A plurality of first conductive vias 260 is formed in the first dielectric layer 25 for electrically connecting to the electrode pads 220.

The package further comprises: a solder mask layer 28 disposed on the first dielectric layer 25 and the first wiring layer 26 and having a plurality of openings 280 for exposing a portion of the first wiring layer 26; and conductive components 29 mounted in the openings 280 on the first wiring layer 26, respectively, as shown in FIG. 4G.

Alternatively, as shown in FIG. 4G', the package can comprise: a built-up structure 27 disposed on the first dielectric layer 25 and the first wiring layer 26; a solder mask layer 28 disposed on the built-up structure 27 and having a plurality of openings 280; and conductive components 29 mounted in the openings 280 for electrically connecting to the first wiring layer 26.

In another embodiment, the package can further comprise: a second wiring layer 36 disposed on the hard layer 231; and a conductive through hole 33 penetrating the first dielectric layer 25, the soft layer 232 and the hard layer 231 for electrically connecting the first and second wiring layers 26, 36.

According to the above-described structure, the package can further comprise: a solder mask layer 38 disposed on the first dielectric layer 25, the first wiring layer 26, the hard layer 231 and the second wiring layer 36 and having a plurality of openings 380 for exposing portions of the first and second wiring layers 26, 36; and conductive components 39 mounted in the openings 380 on the first and second wiring layers 26, 36, as shown in FIG. 6C.

Further referring to FIG. 6D, the package 3 can comprise a built-up structure 37 disposed on the first dielectric layer 25, the first wiring layer 26, the hard layer 231 and the second wiring layer 36; a solder mask layer 38 disposed on the built-up structure 37 and having a plurality of openings 380; and conductive components 39 mounted in the openings 380 and electrically connected to the first and second wiring layers 26, 36.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A fabrication method of a chip scale package, comprising the steps of:
providing a carrier board having an adhesive layer;
mounting at least a chip having an active surface with a plurality of electrode pads and an inactive surface opposite to the active surface, on the adhesive layer via the active surface thereof;
bonding a composite board to the adhesive layer of the carrier board, the composite board comprising a hard layer and a soft layer, wherein the soft layer has opposite first and second surfaces, the hard layer is disposed on the second surface of the soft layer, and the composite board is bonded to the adhesive layer via the first surface of the soft layer in a manner that the chip is embedded in the soft layer;
removing the carrier board having the adhesive layer so as to expose the active surface of the chip and a portion of the first surface of the soft layer;
forming a first dielectric layer on the first surface of the soft layer and the active surface of the chip, followed by forming a plurality of openings in the first dielectric layer to expose the electrode pads of the chip, respectively, and forming at least a through hole penetrating the first dielectric layer, the soft layer, and the hard layer; and
forming on the first dielectric layer a first wiring layer electrically connected to the electrode pads of the chip, forming a second wiring layer on the hard layer, and forming a conductive through hole in the through hole to electrically connect the first and second wiring layers.

2. The method of claim 1, further comprising forming a solder mask layer on the first dielectric layer and the first wiring layer, and forming a plurality of openings in the solder mask layer for mounting of conductive components therein.

3. The method of claim 1, further comprising forming a built-up structure on the first dielectric layer and the first wiring layer.

4. The method of claim 3, further comprising forming a solder mask layer on the built-up structure and forming a plurality of opening in the solder mask layer for mounting of conductive components therein.

5. The method of claim 1, further comprising forming a solder mask layer on the first dielectric layer, the first wiring layer, the hard layer and the second wiring layer and forming a plurality of openings in the solder mask layer for mounting of conductive components therein.

6. The method of claim 1, further comprising forming a built-up structure on the first dielectric layer and the first wiring layer and/or on the hard layer and the second wiring layer.

7. The method of claim 6, further comprising forming a first solder mask layer on the built-up structure and forming a plurality of first openings in the first solder mask layer for mounting a plurality of first conductive components therein.

8. The method of claim 7, wherein when the built-up structure is only formed on the first dielectric layer and the first wiring layer, a second solder mask layer is formed on the hard layer and the second wiring layer, and a plurality of second openings formed in the second solder mask layer are to expose a portion of the second wiring layer for mounting a plurality of the second conductive components in the second openings.

9. The method of claim 7, wherein when the built-up structure is only formed on the hard layer and the second wiring layer, a second solder mask layer is formed on the first dielectric layer and the first wiring layer, and a plurality of second openings formed in the second solder mask layer are to expose a portion of the first wiring layer for mounting a plurality of second conductive components in the second openings.

* * * * *